USOO5764200A

United States Patent [19]
Ödmark

[11] Patent Number: 5,764,200
[45] Date of Patent: Jun. 9, 1998

[54] CONNECTION USING ZEBRA STRIP

[75] Inventor: Ola Ödmark, Uppsala, Sweden

[73] Assignee: Pricer Inc., Norwalk, Conn.

[21] Appl. No.: 356,211

[22] PCT Filed: Jun. 17, 1993

[86] PCT No.: PCT/SE93/00542

§ 371 Date: Dec. 14, 1994

§ 102(e) Date: Dec. 14, 1994

[87] PCT Pub. No.: WO94/00895

PCT Pub. Date: Jan. 6, 1994

[30] Foreign Application Priority Data

Jun. 22, 1992 [SE] Sweden .................................. 9201915

[51] Int. Cl.[6] .................................................. G09G 5/00
[52] U.S. Cl. ............................ 345/2; 345/1; 345/206
[58] Field of Search .............................. 345/2, 1, 205, 345/206

[56] References Cited

U.S. PATENT DOCUMENTS

| D. 348,287 | 6/1994 | Odmark | D20/43 |
| 4,367,467 | 1/1983 | Emile, Jr. | |
| 4,500,880 | 2/1985 | Gomersall et al. | 345/2 |
| 4,646,074 | 2/1987 | Hashimoto | 345/206 |
| 5,537,126 | 7/1996 | Kayser et al. | 345/1 |

FOREIGN PATENT DOCUMENTS

| 40-2097128 | 4/1990 | Japan | 342/2 |
| WO9205499 | 2/1992 | WIPO | |

*Primary Examiner*—Richard Hjerpe
*Assistant Examiner*—Ricardo Osorio
*Attorney, Agent, or Firm*—Young & Thompson

[57] ABSTRACT

The present invention concerns a housing for a price-marking device comprising a thin LCD (30) and a printed circuit board (20) with control electronics and power supply, e.g. a solar cell. The thin LCD (30) is connected to the underlying printed circuit board (30) by a connection device containing conductive rubber areas. Such a device is referred to as a zebra contact strip, the zebra contact strip (15) being arranged between the LCD (30) and the printed circuit board by means of longitudinal parallel enclosing edges (12a, 12b) on the extruded housing (10) preferably made of plastic material and being compressed in a direction across the conducting rubber areas by the action of the longitudinal parallel enclosing edges (12a, 12b) which upon extrudation have been given an inward directed biasing force.

21 Claims, 3 Drawing Sheets

5,764,200

CONNECTION USING ZEBRA STRIP

FIELD OF INVENTION

The present invention relates to connection by means of a so called "zebra strip" or zebra contact, and more exactly by means of an extruded plastic housing to achieve the pressure necessary to connect a display in form of a LCD (Liquid Crystal Device) to a printed circuit board (PCB) by means of a zebra contact.

BACK OF THE INVENTION

For displaying of e.g. price information and other additional information of a merchandise in a shop, normally a price-marking label positioned at the forward edge of the shelf carryinq the merchandise is utilized. According to the state of the art today there is a wish to replace these price labels by electronic units being controlled by a suitable central computer. By this method a great part of the tedious labor for price marking will be avoided at the same time as a guarantee is obtained that the marking of the edge of the shelf will be displaying the price known by the computer and which then controls the registration device at the exit cash register. A demand for such an electronic device for the marking of shelves is that it among other things should be thin not to occupy unnecessary space and should present a corresponding function as of the previous price-marking label, being most often a thin piece of paper To accomplish connection between a printer circuit board and a display in the form of a LCD (Liquid Crystal Display) for such a display for the edge of a shelf one way is to utilize conductive rubber. Such a conductive rubber device is normally referred to as a so called "zebra strip" or zebra contact, why this device. To obtain a proper connection it is required that the conductive rubber should be compressed by about 15%. This compression is necessary to decrease the contact resistance. For this traditionally metal housings having wings which are bent upon assembly have been utilized or screwed joint reinforcements between the printed circuit board and the plastic or metal housings have been used.

All these methods are space consuming and are not suitable for thin products. To connect thin products a method was developed where a LCD and circuit board were joined by means of a flexible printed board and an electrically conducting fusible glue, so called "heat seal". This method however is very prolix and thereby expensive, especially when the LCD has contacts along two or more of its sides.

A SHORT DESCRIPTION OF THE INVENTION

The present invention offers a low-price and practical solution of the above mentioned problem by supplying an extruded housing of preferably PVC plastics for a price-marking device having a display window in form of a LCD, whereby the desired pressure for the compression of the conductive rubber in a zebra contact is achieved by means of a biasing force of the outer forward edge or edges of the plastic structural profile.

An additional object of the present invention is that the outer forward enclosing edge of the housing then centrally over the centrum of the zebra contact, which is making the connection to the LCD), is acting as a lever putting pressure to the glass constituting the front side of the LCD.

Another additional object of the present invention is to further conserve the created pressure by means of a plate member, preferably out of steel or any other rigid material, which member is insert into undercut slot along the edge of the longitudinal side of the housing to the housing to thereby prevent misrun of the housing plastics and a decreasing pressure against the front side of the LCD.

BRIEF DESCRIPTION OF THE DRAWINGS

The invention will be described in form of a preferred embodiment by means of the attached drawings which show.

A PREFERRED EMBODIMENT

Figure 1:
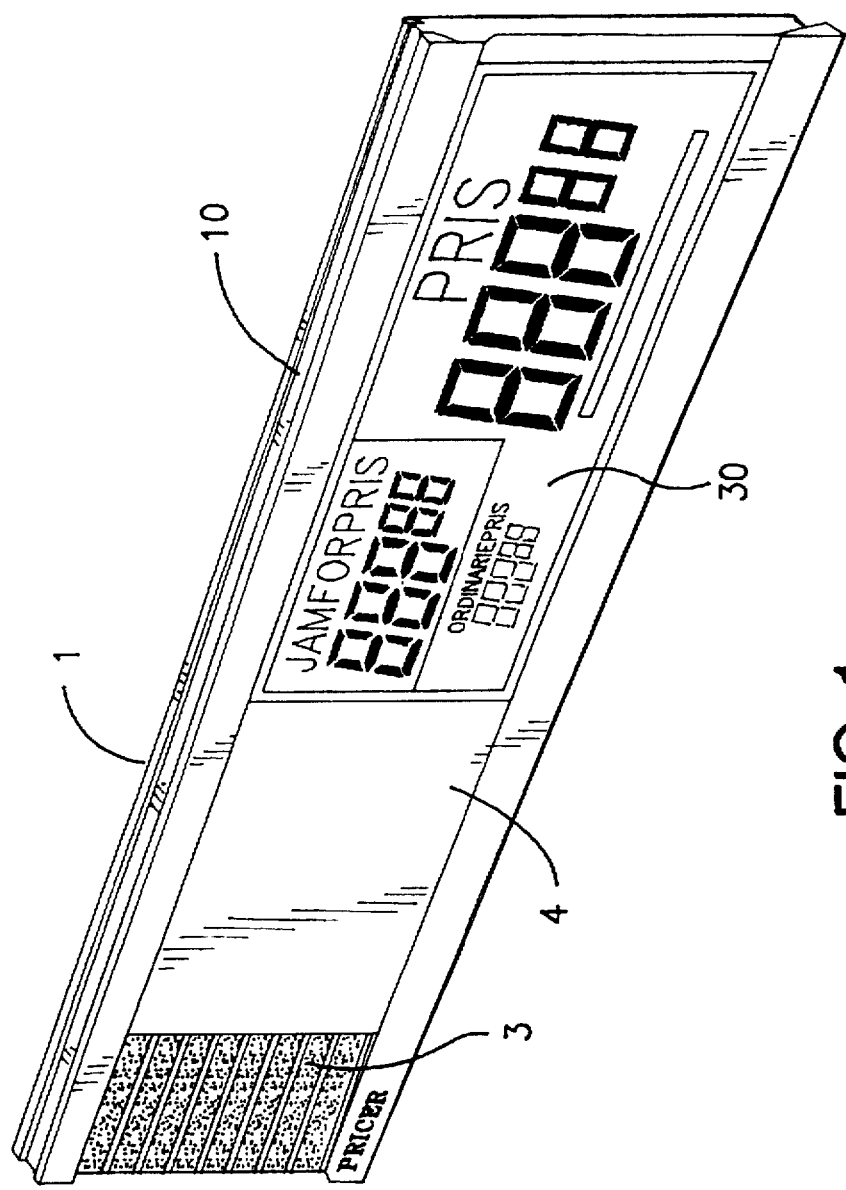
FIG. 1 a price-marking device comprising a display of LCD type and a solar cell for energy supply and having an area for a product label, FIG. 2 an exemplifying portion of a printed circuit board for connection a display of LCD type, shown in FIG. 1, FIG. 3 a partly intersected illustration of a zebra contact, FIG. 4 an intersection of the right portion of the price-marking device of FIG. 1 formed as an extruded plastic housing according to the present invention, and FIG. 5 an intersection of the left portion of the price-marking device of FIG. 1 formed as an extruded plastic housing according to the present invention.
Figure 2:
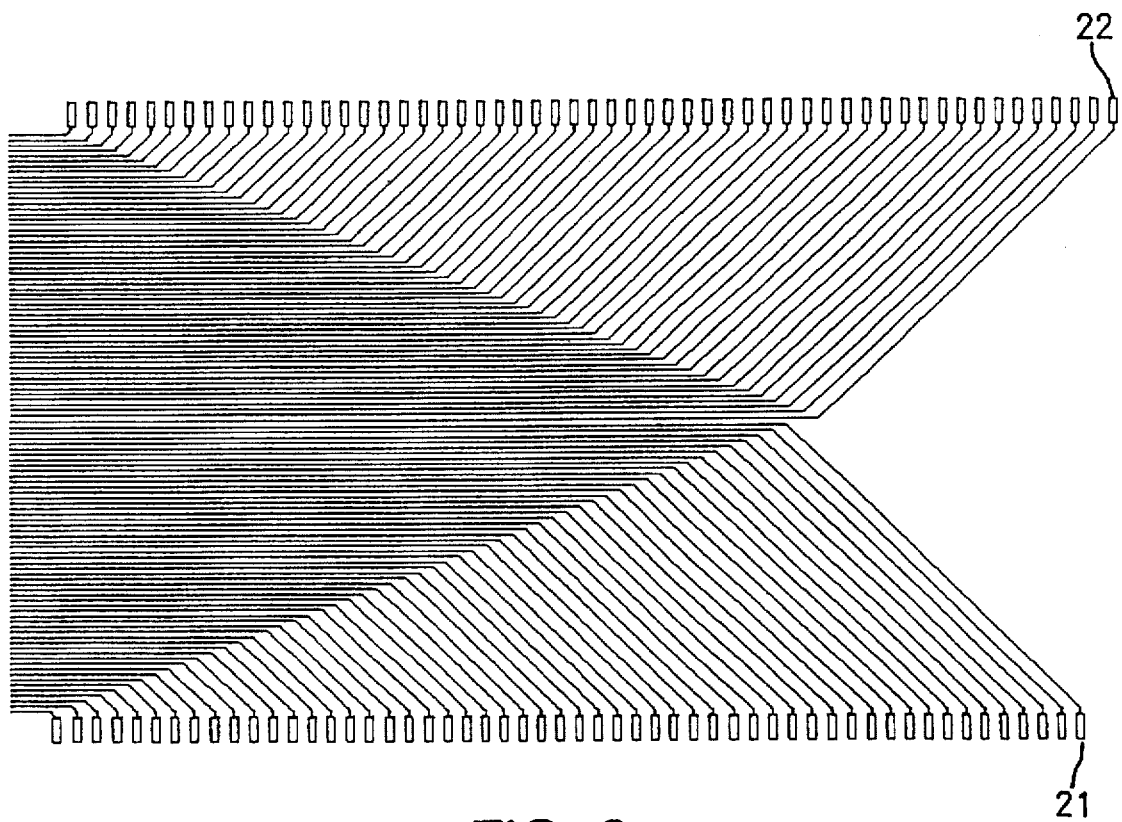
Figure 5:
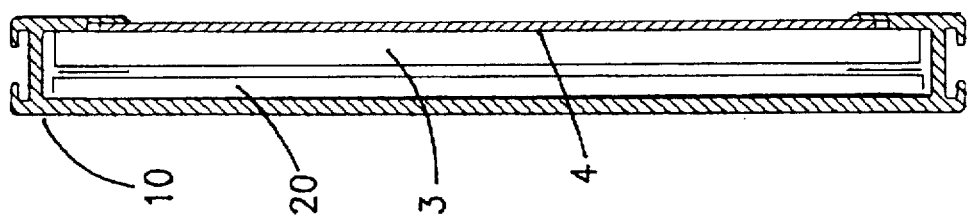

FIG. 1 demonstrates in a preferred embodiment a price-marking device 1 intended to be attached to an edge of a shelf. The device 1 is comprising a display which constitutes a LCD 30 which by 7-segment character technique shows e.g. the price of an article, a comparison price and an ordinary price if the article temporarily being price reduced. The field for the comparison price is having a yellow background in the embodiment. Additionally the device comprises a solar cell 3 for energy supply of the device 1 and a label field 4 for insertion of a paper having a preprinted article information which normally will be delivered with a large packing of a merchandise. The device further consists of a printed circuit board having a number of integrated circuits and other electronic components such as e.g. an IR receiver for transmission of price information to the price-marking device from a central computer his printed circuit board additionally provides the LCD 30 with control voltages. The total device is contained in a thin extruded structural profile or a housing 10 preferably out of a plastic material. In FIG. 2 is demonstrated an enlarged portion of the printed circuit pattern of the printed circuit board 20, which portion shown for the LCD 30 includes a multitude of connector terminals 21 and 22, respectively, whereby the LCD provides corresponding terminal fields (not shown). As shown by FIG. 2 a large number of contact points are needed, which then must be made having a relatively small graduation to facilitate a compact size of the printed circuit board and consequently of the price-marking device, whereby principally the width of the LCD will mainly decide the size of the device. In the embodiment this connection between the printed circuit board and the LCD is made by means of an arrangement of conductive rubber in form of two zebra contact strips 15 (FIG. 4), one at the upper edge of the printed circuit board and the LCD 30 and one at the lower edge of the printed circuit board and the LCD 30.

Figure 3:
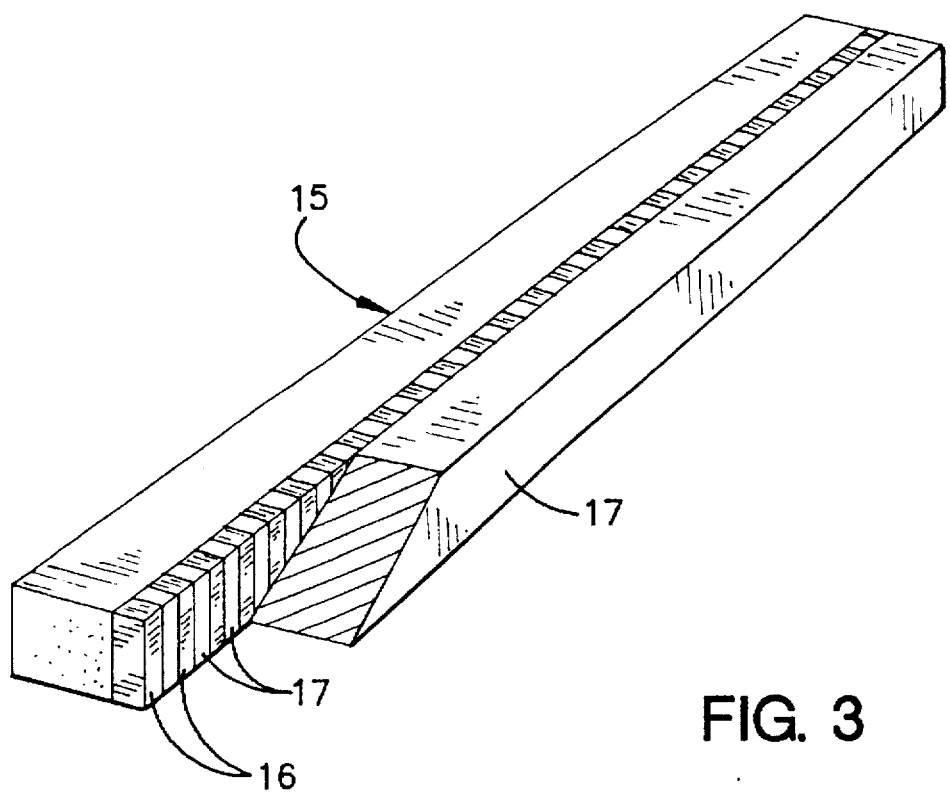

The principle of such a zebra contact strip is shown in FIG. 3. The dark areas 16 consist of conducting rubber while the rest of the strip constitutes nonconducting material 17. To accomplish contact between the printed circuit board 20 and the LCD 30 such a zebra contact strip 15 is positioned over the terminal fields 21 and 22, respectively, and the LCD, on the rear side having corresponding contacts, is then positioned on top of- the zebra contacts by the pitch of the pattern is always ensured that at least a part, preferably all, of the conducting rubber is landing against the terminal fields 21 and 22, respectively in a similar way due to the pitch of the pattern it is not possible that the conducting rubber may land over two contact and short-circuit these. To obtain an acceptable electrical transmission line between the printed circuit board and the LCD it is desirable that the zebra contact is compressed by at least about 15% by compressing the LCD and the oriented circuit board against each other in a suitable way. This contact pressure is achieved by a special extruded structural profile or a housing 10 preferably out of a PVC plastic material.

Figure 4:
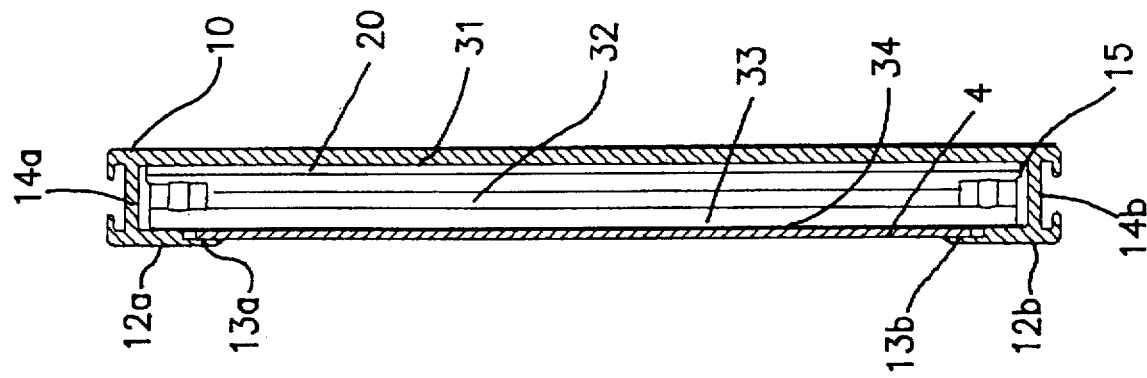

Finally FIG. 4 is showing an intersection of the price-marking device 1, shown in Fig. 1, at its left side comprising the solar cell 4, which preferably presents a thickness approximately corresponding to the total LCD 30 including its reflector 31, rear glass 32 and front glass 33 as well as polarization filter 34. The solar cell rests in a suitable way against the printed circuit board e.g. by means of a resilient material between the printed circuit board and the solar cell. The portion constituting the base for the label 4 preferably is made out of a plastic plate having the same thickness as the solar cell. Thus, in another embodiment it is simple e.g. To have the solar cell 3 and the label 4 to change place.

The housing 10 presents a somewhat biased frame edge 12a and 12b, respectively, which above all will exert the desired pressure upon the LCD to achieve a suitable compression of the zebra contact or the zebra contacts. The frame edges 12a and 12b, respectively, additionally present edge slots 13a and 13b, respectively, for reception of a label 4. The housing 1 of the embodiment further at its upper and lower longitudinal edges presents an undercut slot 14 which is intended for receiving a strip of metal or plastic to further stiffen the housing when the printed circuit board 20, the LCD 30 and the solar cell 3 are assembled within the housing 10. The strip may be given a U form having a distance between the shanks corresponding to the shorter sides of the price-marking device 1. The length of the shanks then preferably are equal to half the length of the device 1, whereby such a U form will be inserted in the upper slot 14a and the lower slot 14b from each direction at the shorter sides. In another embodiment the shanks constitute two lying L forms which in a corresponding way are inserted each from its different side. However, making the housing out of a suitable material by extrudating, it has unexpectedly be found to possess a sufficient resilient force in the frame edges 12a and 12b, why as such the additional strips in the undercut slots 14a and 14b only constitute a further locking at the same time as the strips anyhow are offering an additional protection of the edges of the price-marking device 1.

By means of the housing in accordance with the present invention which facilitates simple connection by zebra contacts, a very compact device regarding thickness is obtained at the same time as it is very cheap to produce and simple to assemble and is presenting the desired characteristics.

I claim:

1. A method in connection to a price-marking device (1) comprising a thin LCD (30) and a printed circuit board (20) with control electronics and power supply, e.g. a solar cell, for the connection of said thin LCD (30) to said printed circuit board (20) by means of a connection device of conductive rubber in form of a so called zebra contact strip (15), characterized in that said zebra contact strip (15) in a direction across the conducting rubber areas is compressed between said thin LCD (30) and said printed circuit board (20) by means of an extruded housing (10), preferably out of plastic material, the outer forward enclosing edges (12a, 12b) of which are biased upon production, that at least the longitudinal parallel enclosing edges (12a, 12b) of said housing in design and material are biased such that inner surfaces of said longitudinal parallel enclosing edges are centered over the center of the zebra contact (15) along the corresponding edges of said thin LCD (30) and said printed circuit board (20) comprising terminal fields (21, 22) for signal transmission between said thin LCD and the printed circuit board is acting as a lever exerting pressure against a glass (33) constituting the front side of said thin LCD, whereby a compression of at least 15% of the conducting rubber of said zebra contact (15) is accomplished.

2. The method according to claim 1, characterized in that said extruded housing (10) at least along its longitudinal parallel enclosing edges is provided with an undercut slot (14a, 14b) for the reception of a stiffening plastics or metal plate member.

3. The method according to claim 1, characterized in that the longitudinal parallel enclosing edges (12a, 12b) of said extruded housing (10) are provided with an internal slot forming a thin attachment slot (13a, 13b) for a label having article information and being inserted under a portion of the outer enclosing parts directed towards the center of the price-marking device.

4. The method according to claim 1, characterized in that the biasing force of the longitudinal parallel enclosing edges (12a, 12b) is accomplished by means of the longitudinal parallel enclosing edges (12a, 12b) upon extrudation are obtaining a slightly inward inclined direction towards the rear side of said housing (10).

5. The method according to claim 1, characterized in that the front glass (33) of said thin LCD on which the terminal fields for electric connection of said thin LCD are present, is made slightly wider that the rear glass (32), whereby an alignment and support edge for said zebra contact strip (15) is obtained along the upper and/or lower edge of said rear glass (32).

6. An arrangement for price-marking device (1) comprising a thin LCD (30) and a printed circuit board (20) with control electronics and power supply, e.g. a solar cell, said thin LCD (30) being connected to said printed circuit board (20) by means of a connection device of conductive rubber in form of a so called zebra contact strip (15), characterized in that said zebra contact strip (15) in a longitudinal direction of the conducting rubber areas is arranged compressed between said thin LCD (30) and said printed circuit board (20) by means of longitudinal parallel enclosing edges (12a, 12b) of the extruded housing (10), preferably made of plastic material, and which longitudinal parallel enclosing edges (12a, 12b) upon production through extrudation are provided with an inward directed biasing force, that at least the longitudinal parallel enclosing edges (12a, 12b) of said housing in design and material are arranged biased such that inner surfaces of said longitudinal parallel enclosing edges centered over the center of the zebra contact (15) along the corresponding edges of said thin LCD (30) and said printed circuit board (20) comprising terminal fields (21, 22) for signal transmission between said thin LCD and the printed circuit board are acting as a lever exerting pressure against a glass (33) constituting the front side of said thin LCD, whereby these longitudinal parallel enclosing edges supply a compression of at least 15% of the conducting rubber of said zebra contact (15).

7. The arrangement according to claim 6, characterized in that said extruded housing (10) at least along its longitudinal parallel enclosing edges is provided with an undercut slot (14a, 14b) for reception of a stiffening plastics or metal plate member.

8. The arrangement according to claim 7, characterized in that the longitudinal parallel enclosing edges (12a, 12b) of said extruded housing (10) are provided with an internal slot creating a thin attachment slot (13a, 13b) for a label provided with article information and being inserted under a portion of the outer enclosing parts which are directed towards the center of the price-marking device.

9. The arrangement according to claim 8, characterized in that the longitudinal parallel enclosing edges (12a, 12b) upon extrudation are slightly directed inward inclined towards the rear side of said housing (10).

10. The arrangement according to claim 6, characterized in
that the front glass (33) of said thin LCD on which terminal fields for electric connection of said thin LCD are present, is made slightly wider than the rear glass (32), whereby an alignment and support edge for said zebra contact strip (15) is obtained along the upper and/or lower edge of said rear glass (32).

11. The method according to claim 2, characterized in
that the front glass (33) of said thin LCD on which the terminal fields for electric connection of said thin LCD are present, is made slightly wider than the rear glass (32), whereby an alignment and support edge for said zebra contact strip (15) is obtained along the upper and/or lower edge of said rear glass (32).

12. The method according to claim 3, characterized in
that the front glass (33) of said thin LCD on which the terminal fields for electric connection of said thin LCD are present, is made slightly wider than the rear glass (32), whereby an alignment and support edge for said zebra contact strip (15) is obtained along the upper and/or lower edge of said rear glass (32).

13. The method according to claim 4, characterized in
that the front glass (33) of said thin LCD on which the terminal fields for electric connection of said thin LCD are present, is made slightly wider than the rear glass (32), whereby an alignment and support edge for said zebra contact strip (15) is obtained along the upper and/or lower edge of said rear glass (32).

14. The arrangement according to claim 7, characterized in
that the front glass (33) of said thin LCD on which terminal fields for electric connection of said thin LCD are present, is made slightly wider than the rear glass (32), whereby an alignment and support edge for said zebra contact strip (15) is obtained along the upper and/or lower edge of said rear glass (32).

15. The arrangement according to claim 8, characterized in
that the front glass (33) of said thin LCD on which terminal fields for electric connection of said thin LCD are present, is made slightly wider than the rear glass (32), whereby an alignment and support edge for said zebra contact strip (15) is obtained along the upper and/or lower edge of said rear glass (32).

16. The arrangement according to claim 9, characterized in
that the front glass (33) of said thin LCD on which terminal fields for electric connection of said thin LCD are present, is made slightly wider than the rear glass (32), whereby an alignment and support edge for said zebra contact strip (15) is obtained along the upper and/or lower edge of said rear glass (32).

17. A price marking device, comprising:

a liquid crystal display comprising connector terminals;

a printed circuit board comprising terminal fields;

a zebra contact strip, positioned between and in contact with said liquid crystal display and said printed circuit, and comprising conductive rubber areas, said conductive rubber areas electrically connecting said connector terminals to said terminal fields; and means for confining together said liquid crystal display, said printed circuit board and said zebra contact strip and for compressing said conductive rubber areas, in a longitudinal direction extending between said liquid crystal display and said printed circuit board, by at least about 15%.

18. The price marking device of claim 17 wherein said confining and compressing means comprises a housing having a rear side adjacent said printed circuit board and longitudinal parallel enclosing edges coupled to said rear side and being adjacent said liquid crystal display, said longitudinal parallel enclosing edges being configured to urge said liquid crystal display towards said rear surface to compress said conductive rubber areas said at least about 15%.

19. The price marking device of claim 18 wherein said longitudinal parallel enclosing edges are biased towards said rear wall.

20. The price marking device of claim 18 wherein said longitudinal parallel enclosing edges comprises first longitudinal parallel enclosing edges and second longitudinal parallel enclosing edges.

21. The price marking device of claim 20 wherein said printed circuit board has a first edge adjacent first terminal fields and a second edge adjacent second terminal fields, said liquid crystal display has one edge adjacent first connector terminals and another edge adjacent second connector terminals, and said zebra contact strip has a first edge segment adjacent first conductive rubber areas and a second edge segment adjacent second conductive rubber areas, and further wherein said first longitudinal parallel enclosing edges comprise a first enclosing edge portion and said second longitudinal parallel enclosing edges comprise a second enclosing edge portion, said first enclosing edge portion being centered over said first conductive rubber areas and being configured to urge said one edge towards said rear surface to compress said first conductive rubber areas said at least about 15%, and said second enclosing edge portion being centered over said second conductive rubber areas and being configured to urge said another edge towards said rear surface to compress said second conductive rubber areas said at least about 15%.

* * * * *